(12) United States Patent
Sugiura et al.

(10) Patent No.: US 6,259,251 B1
(45) Date of Patent: Jul. 10, 2001

(54) RF COIL AND MAGNETIC RESONANCE IMAGING METHOD AND APPARATUS

(75) Inventors: Sunao Sugiura; Yasushi Kato; Yukitoshi Shimo, all of Tokyo (JP)

(73) Assignee: GE Yokogawa Medical Systems, Limited, Tokyo (JP)

(*) Notice: Subject to any disclaimer, the term of this patent is extended or adjusted under 35 U.S.C. 154(b) by 0 days.

(21) Appl. No.: 09/481,071

(22) Filed: Jan. 11, 2000

(51) Int. Cl.[7] .................................................. G01V 3/00
(52) U.S. Cl. ............................ 324/318; 324/309; 324/322
(58) Field of Search ............................. 324/318, 322, 324/309, 314, 307, 311

(56) References Cited

U.S. PATENT DOCUMENTS

| | | | |
|---|---|---|---|
| 5,473,251 | 12/1995 | Mori | 324/318 |
| 5,517,120 | * 5/1996 | Misic et al. | 324/328 |
| 5,578,925 | 11/1996 | Molyneaux | 324/318 |
| 5,760,583 | * 6/1998 | Sato et al. | 324/318 |

FOREIGN PATENT DOCUMENTS

| | | |
|---|---|---|
| 19505062 | 10/1995 | (DE) . |
| 0957368 | 11/1999 | (EP) . |
| 2139610 | 11/1990 | (JP) . |
| 323842 | 1/1991 | (JP) . |
| 3109041 | 5/1991 | (JP) . |
| 7231881 | 9/1995 | (JP) . |

* cited by examiner

*Primary Examiner*—Christine Oda
*Assistant Examiner*—Brij B. Shrivastav

(57) ABSTRACT

In order to provide a quadrature RF coil having a good frequency property, and a magnetic resonance imaging method and apparatus employing such an RF coil, in combining two coil loops comprising main paths 602, 604 (612, 614) connected in series via tie paths 606, 608 (616, 618) with the main paths 602, 604 (612, 614) orthogonally crossed, the tie paths 606, 608 (616, 618) are made not to overlap one another.

5 Claims, 5 Drawing Sheets

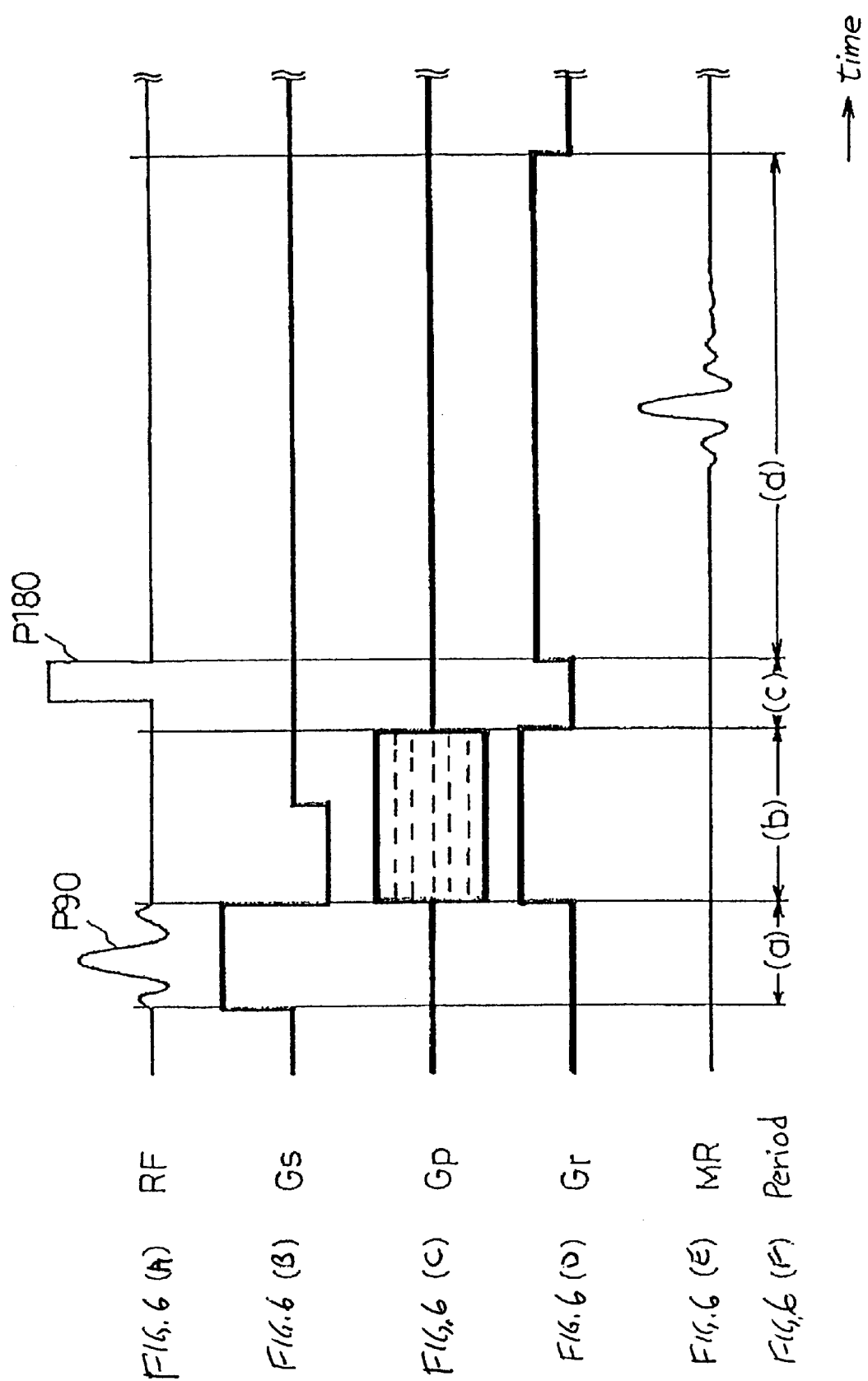

RF COIL AND MAGNETIC RESONANCE IMAGING METHOD AND APPARATUS

BACKGROUND OF THE INVENTION

The present invention relates to an RF (radio frequency) coil and a magnetic resonance imaging method and apparatus, and more particularly to an RF coil for generating an RF magnetic field in a direction parallel to a loop surface of the coil, and a magnetic resonance imaging method and apparatus employing such an RF coil.

A magnetic resonance imaging apparatus with a static magnetic field direction perpendicular to the body axis of a subject, commonly referred to as a vertical magnetic field-type magnetic resonance imaging apparatus, generates an open static magnetic field space, and hence employs as an RF coil for generating the RF magnetic field an RF coil having a loop surface parallel to the pole piece surface of a static magnetic field generating unit. The RF coil of this type generates the RF magnetic field in the direction parallel to the coil loop surface to form the RF magnetic field perpendicular to the static magnetic field direction. Such an RF coil is disclosed in U.S. Pat. No. 5,760,583 of the present applicant.

On the other hand, there is another type of an RF coil referred to as a quadrature RF coil, which consists of a combination of two RF coils, and can provide an RF magnetic field having an increased strength through vector composition of respective RF magnetic fields generated by the two RF coils or can reduce a drive power per coil to generate the RF magnetic field of a desired strength.

SUMMARY OF THE INVENTION

It is an object of the present invention to provide a quadrature RF coil having a good frequency property, and a magnetic resonance imaging method and apparatus employing such an RF coil.

In accordance with a first aspect of the invention, there is provided an RF coil comprising: when three mutually orthogonal directions are represented as an x-direction, a y-direction and a z-direction, a first electric path extending in the x-direction; a second electric path parallel to the first electric path in an x-y plane; a third electric path parallel to the first electric path in an x-z plane; a fourth electric path parallel to the third electric path in a plane parallel to the x-y plane, and parallel to the second electric path in a plane parallel to the x-z plane; a fifth electric path connecting the first–fourth electric paths in series so that the first and second electric paths carry respective electric currents in the same direction, and the third and fourth electric paths carry respective electric currents in the same direction opposite to the direction of the first and second electric paths; a sixth electric path extending in the y-direction in the x-y plane; a seventh electric path parallel to the sixth electric path in the x-y plane; an eighth electric path parallel to the sixth electric path in a y-z plane; a ninth electric path parallel to the eighth electric path in a plane parallel to the x-y plane, and parallel to the seventh electric path in a plane parallel to the y-z plane; and a tenth electric path connecting the sixth–ninth electric paths in series so that the sixth and seventh electric paths carry respective electric currents in the same direction, and the eighth and ninth electric paths carry respective electric currents in the same direction opposite to the direction of the sixth and seventh electric paths; wherein the fifth electric path and the tenth electric path do not overlap each other in the z-direction.

In accordance with a second aspect, there is provided the RF coil as described regarding the first aspect, wherein one of the fifth and tenth electric paths lies inside of the other one in the x-y plane, and the other one of the fifth and tenth electric paths lies inside of the one of the fifth and tenth electric paths in the plane parallel to the x-y plane.

In accordance with a third aspect, there is provided an RF coil comprising: when three mutually orthogonal directions are represented as an x-direction, a y-direction and a z-direction, a first electric path extending in the x-direction; a second electric path parallel to the first electric path in an x-y plane; a fifth electric path connecting the first and second electric paths in series so that the first and second electric paths carry respective electric currents in the same direction; a sixth electric path extending in the y-direction in the x-y plane; a seventh electric path parallel to the sixth electric path in the x-y plane; and a tenth electric path connecting the sixth and seventh electric paths in series so that the sixth and seventh electric paths carry respective electric currents in the same direction; wherein the fifth electric path and the tenth electric path do not overlap each other in the z-direction.

In accordance with a fourth aspect, there is provided a magnetic resonance imaging method comprising the steps of: when three mutually orthogonal directions in a space in which a subject is placed are represented as an x-direction, a y-direction and a z-direction, generating a static magnetic field in the z-direction; generating gradient magnetic fields within the space; generating a high-frequency magnetic field within the space; measuring a magnetic resonance signal from the space; and producing an image based on the measured magnetic resonance signal; wherein the step of generating a high-frequency magnetic field is performed by employing an RF coil comprising: a first electric path extending in the x-direction; a second electric path parallel to the first electric path in an x-y plane; a third electric path parallel to the first electric path in an x-z plane; a fourth electric path parallel to the third electric path in a plane parallel to the x-y plane, and parallel to the second electric path in a plane parallel to the x-z plane; a fifth electric path connecting the first–fourth electric paths in series so that the first and second electric paths carry respective electric currents in the same direction, and the third and fourth electric paths carry respective electric currents in the same direction opposite to the direction of the first and second electric paths; a sixth electric path extending in the y-direction in the x-y plane; a seventh electric path parallel to the sixth electric path in the x-y plane; an eighth electric path parallel to the sixth electric path in a y-z plane; a ninth electric path parallel to the eighth electric path in a plane parallel to the x-y plane, and parallel to the seventh electric path in a plane parallel to the y-z plane; and a tenth electric path connecting the sixth–ninth electric paths in series so that the sixth and seventh electric paths carry respective electric currents in the same direction, and the eighth and ninth electric paths carry respective electric currents in the same direction opposite to the direction of the sixth and seventh electric paths; wherein the fifth electric path and the tenth electric path do not overlap each other in the z-direction.

In accordance with a fifth aspect, there is provided a magnetic resonance imaging apparatus comprising: when three mutually orthogonal directions in a space in which a subject is placed are represented as an x-direction, a y-direction and a z-direction, static magnetic field generating means for generating a static magnetic field in the z-direction; gradient magnetic field generating means for generating gradient magnetic fields within the space; high-frequency magnetic field generating means for generating a high-frequency magnetic field within the space; measuring means for measuring a magnetic resonance signal from the space; and image producing means for producing an image based on the magnetic resonance signal measured by the measuring means; wherein the high-frequency magnetic field generating means comprises an RF coil comprising: a first electric path extending in the x-direction; a second electric path parallel to the first electric path in an x-y plane; a third electric path parallel to the first electric path in an x-z plane; a fourth electric path parallel to the third electric path in a plane parallel to the x-y plane, and parallel to the second electric path in a plane parallel to the x-z plane; a fifth electric path connecting the first–fourth electric paths in series so that the first and second electric paths carry respective electric currents in the same direction, and the third and fourth electric paths carry respective electric currents in the same direction opposite to the direction of the first and second electric paths; a sixth electric path extending in the y-direction in the x-y plane; a seventh electric path parallel to the sixth electric path in the x-y plane; an eighth electric path parallel to the sixth electric path in a y-z plane; a ninth electric path parallel to the eighth electric path in a plane parallel to the x-y plane, and parallel to the seventh electric path in a plane parallel to the y-z plane; and a tenth electric path connecting the sixth–ninth electric paths in series so that the sixth and seventh electric paths carry respective electric currents in the same direction, and the eighth and ninth electric paths carry respective electric currents in the same direction opposite to the direction of the sixth and seventh electric paths; wherein the fifth electric path and the tenth electric path do not overlap each other in the z-direction.

In any one of the inventions as described regarding the first–fifth aspects, it is preferred that pairs of the electric paths mutually intersecting in the x-y plane be crossed with their intersections interlaced in that equality between the respective RF magnetic fields generated by these electric path pairs is improved.

In the present invention, coupling between the coils through drift capacity is reduced because the tie paths do not overlap each other in the z-direction.

Thus, in accordance with the present invention, a quadrature RF coil having a good frequency property, and a magnetic resonance imaging method and apparatus employing such an RF coil can be implemented.

Further objects and advantages of the present invention will be apparent from the following description of the preferred embodiments of the invention as illustrated in the accompanying drawings.

BRIEF DESCRIPTION OF THE DRAWINGS

FIG. 6(A)–6(F) are schematic diagram illustrating an exemplary pulse sequence executed by the apparatus.

DETAILED DESCRIPTION OF THE DRAWINGS

Figure 1:
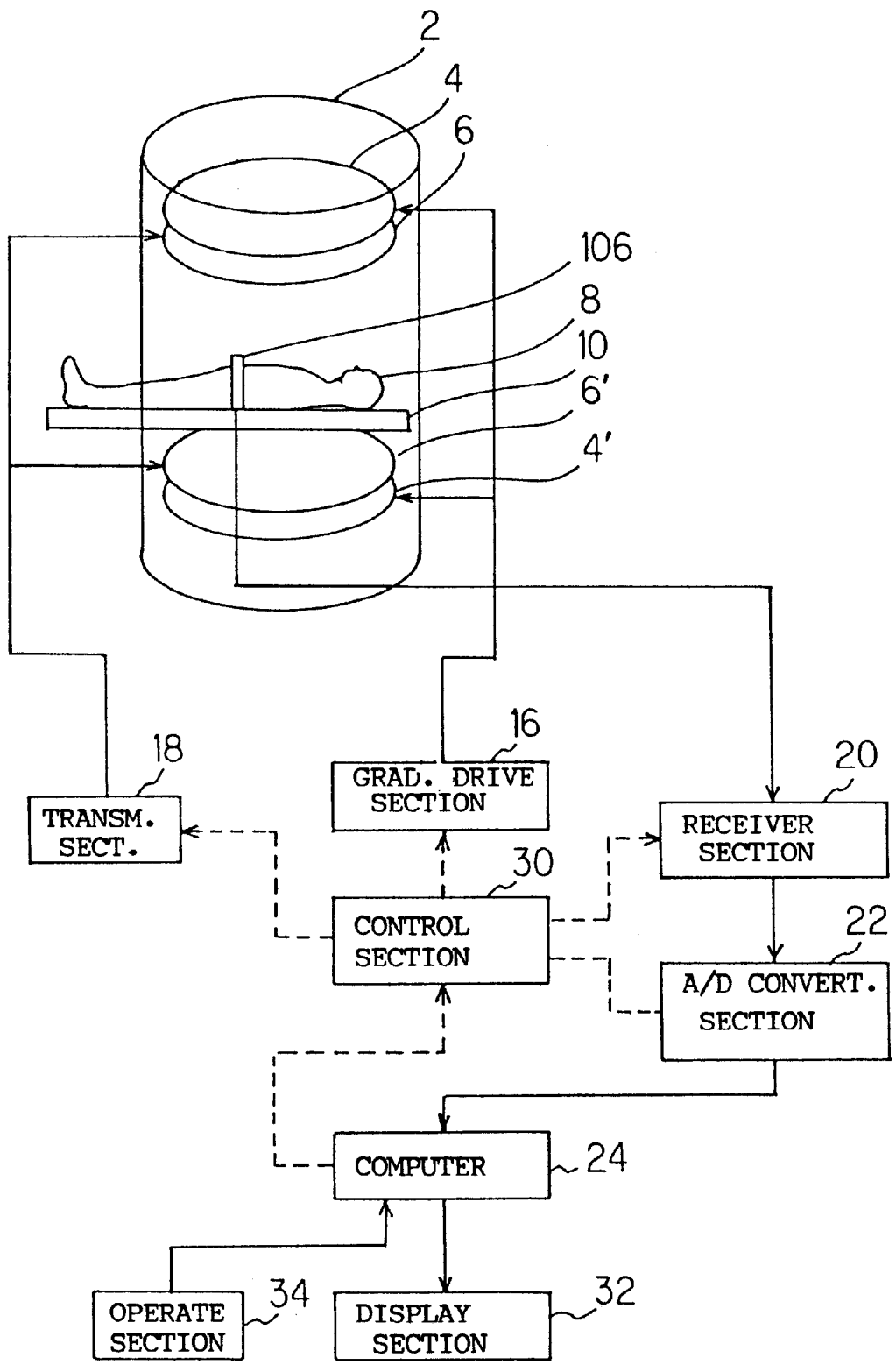
FIG. 1 is a block diagram of an exemplary apparatus in accordance with one embodiment of the present invention.

The embodiments of the present invention will now be described in more detail with reference to the accompanying drawings. FIG. 1 shows a block diagram of a magnetic resonance imaging apparatus which is one embodiment of the present invention. The configuration of the apparatus represents an embodiment of the apparatus in accordance with the present invention, and the operation of the apparatus represents an embodiment of the method in accordance with the present invention.

As shown in FIG. 1, the apparatus comprises a static magnetic field generating section 2 which generates a homogeneous static magnetic field in its internal space. The static magnetic field generating section 2 represents an embodiment of the static magnetic field generating means of the present invention. The static magnetic field generating section 2 comprises a pair of magnetism generators (not shown), such as permanent magnets, which face each other in the vertical direction with a certain spacing, generating the static magnetic field (vertical magnetic field) within the interposed space. Obviously, the magnetism generator is not limited to the permanent magnet but may be a superconductive electromagnet, a normal conductive electromagnet or the like.

Within the internal space of the static magnetic field generating section 2 are disposed gradient coil sections 4, 4', and transmit coil sections 6, 6' facing each other likewise in the vertical direction with a certain spacing, respectively. The transmit coil sections 6, 6' represent an embodiment of the RF coil of the present invention. Description on the transmit coil sections 6, 6' will be made later.

A subject 8 is placed on an imaging table 10 and carried into a space interposed between the opposing transmit coil sections 6, 6' by carrying means (not shown). The body axis of the subject 8 is orthogonal to the static magnetic field direction. The imaging table 10 is attached with a receive coil section 106 surrounding a site of the subject 8 to be imaged. The receive coil section 106 is one for imaging the L-spine (lumbar spine), for example, and is attached enveloping the hip of the subject 8. The receive coil section 106 may be disposed not only around the L-spine but at any position corresponding to a desired site to be imaged.

The gradient coil sections 4, 4' are connected with a gradient driving section 16. The gradient driving section 16 supplies the gradient coil sections 4, 4' with a drive signal to generate gradient magnetic fields. The gradient coil sections 4, 4' and the gradient driving section 16 together represent an embodiment of the gradient magnetic field generating means of the present invention. The gradient magnetic fields to be generated are following three: a slice gradient magnetic field, a readout gradient magnetic field and a phase-encoding gradient magnetic field.

The transmit coil sections 6, 6' are connected with a transmitter section 18. The transmitter section 18 supplies the transmit coil sections 6, 6' with a drive signal to generate the RF magnetic field, thereby exciting spins within the subject 8. The transmit coil sections 6, 6' and the transmitter section 18 together represent an embodiment of the high-frequency magnetic field generating means of the present invention.

The receive coil section 106 receives a magnetic resonance signal generated by the excited spins within the subject 8. The receive coil section 106 is connected to the input of a receiver section 20 and inputs the received signal to the receiver section 20.

The output of the receiver section 20 is connected to the input of an analog-to-digital (A-D) converter section 22. The A-D converter section 22 converts an output signal of the receiver section 20 into a digital signal.

The receive coil section 106, the receiver section 20 and the A-D converter section 22 together represent an embodiment of the measuring means of the present invention. The output of the A-D converter section 22 is connected to a computer 24.

The computer 24 receives the digital signal from the A-D converter section 22 and stores the signal into a memory (not shown). Thus a data space is formed in the memory. The data space constitutes a two-dimensional Fourier space. The computer 24 performs a two-dimensional inverse Fourier transformation on the data in the two-dimensional Fourier space to reconstruct an image of the subject 8. The computer 24 represents an embodiment of the image producing means of the present invention.

The computer 24 is connected to a control section 30. The control section 30 is connected to the gradient driving section 16, the transmitter section 18, the receiver section 20 and the A-D converter section 22. The control section 30 controls the gradient driving section 16, the transmitter section 18, the receiver section 20 and the A-D converter section 22 based on instructions supplied from the computer 24 to execute the magnetic resonance imaging.

The computer 24 is connected with a display section 32 and an operating section 34. The display section 32 displays a reconstructed image and several information output from the computer 24. The operating section 34 is operated by a human operator inputting several commands and information to the computer 24.

Figure 2:
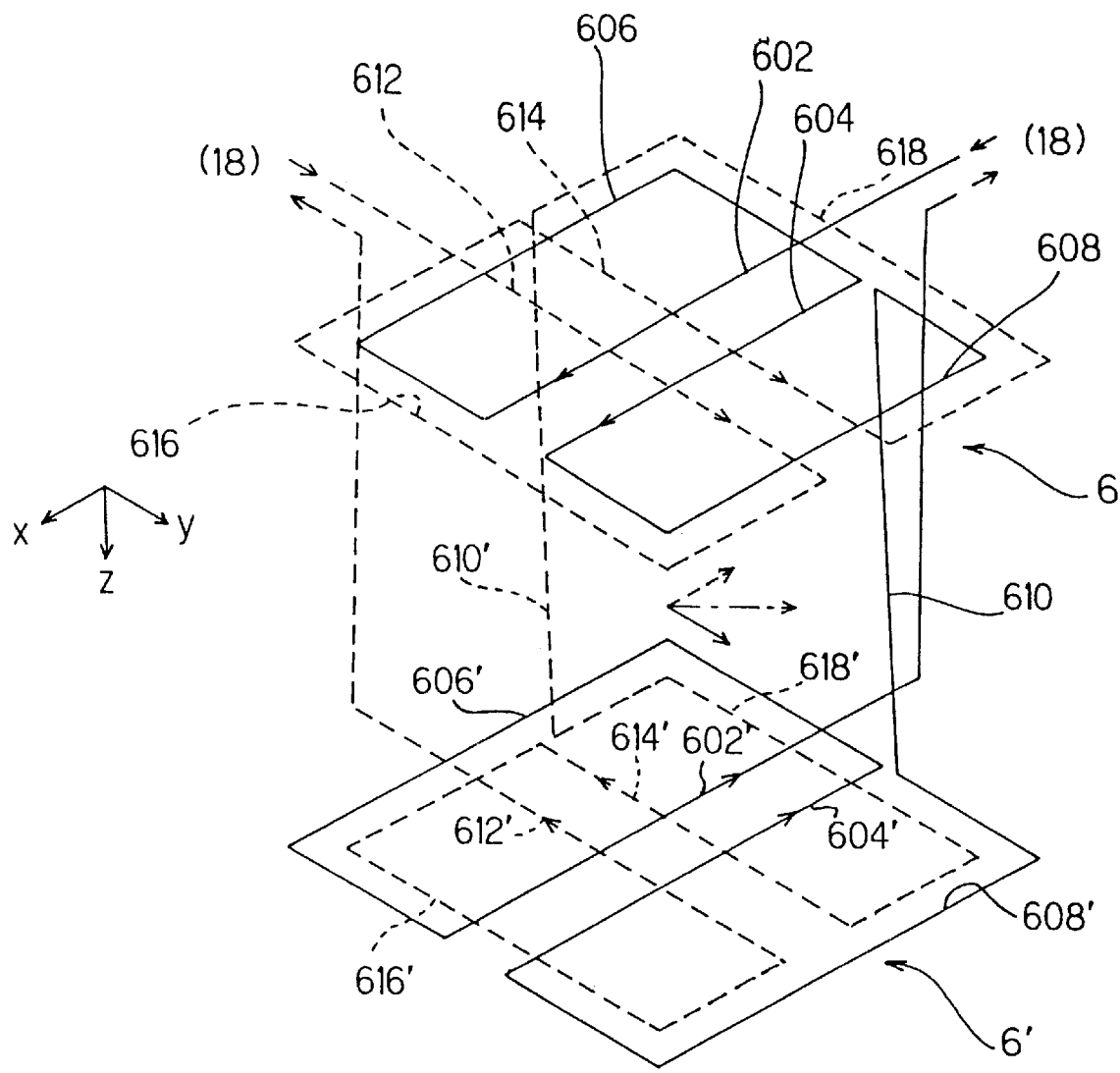
FIG. 2 is a schematic diagram illustrating the configuration of a transmit coil section in the apparatus in accordance with one embodiment of the present invention.

FIG. 2 schematically shows the configuration of the transmit coil sections 6, 6'. FIG. 2 illustrates the three-dimensional structure of electric paths of an RF coil which constitutes a main portion of the transmit coil section 6, 6'. Three mutually orthogonal directions in the three-dimensional space is designated as x, y and z. The z-direction is the static magnetic field direction. As shown, one transmit coil section 6 has electric paths configured on an x-y plane, and the other transmit coil section 6' has electric paths configured on another x-y plane spaced apart from the former x-y plane in the z-direction.

The transmit coil section 6 has two parallel main paths 602, 604 extending in the x-direction. The main paths 602 and 604 represent embodiments of the first and second electric paths of the present invention, respectively.

One end of the main path 602 is connected to the transmitter section 18 and the other end thereof is connected to one end of the main path 604 via a tie path 606. The tie path 606 detours on the x-y plane on the side opposite to the side on which the main path 604 lies, and connects the other end of the main path 602 and the one end of the main path 604.

Although the tie path 606 is exemplarily illustrated as a straight line path traveling around bending by 90° at the corners, it is not limited thereto but may be a generally semicircular line or an appropriate curve line traveling around from the other end of the main path 602 to the one end of the main path 604. This also applies to like components which will be described below.

The other end of the main path 604 is connected to one end of a tie path 610 via a tie path 608 which detours on the side opposite to the side on which the main path 602 lies. The tie path 610 connects the transmit coil sections 6 and 6'.

Although the tie path 608 is exemplarily illustrated as a straight line path traveling around bending by 90° at the corners, it is not limited thereto but may be a generally semicircular line or an appropriate curve line traveling around from the other end of the main path 604 to the one end of the tie path 610. This also applies to like components which will be described below.

The transmit coil section 6 also has two parallel main paths 612 and 614 extending in the y-direction. The main paths 612 and 614 represent embodiments of the sixth and seventh electric paths of the present invention, respectively.

One end of the main path 612 is connected to the transmitter section 18 and the other end thereof is connected to one end of the main path 614 via a tie path 616. The tie path 616 detours on the x-y plane on the side opposite to the side on which the main path 614 lies, and connects the other end of the main path 612 and the one end of the main path 614. The tie path 616 is configured to pass outside of the tie paths 606 and 608.

The other end of the main path 614 is connected to one end of a tie path 610' via a tie path 618 which detours on the side opposite to the main path 612. The tie path 610' connects the transmit coil sections 6 and 6'. The tie path 618 is configured to pass outside of the tie paths 606 and 608.

According to such electric path configuration, the main paths 602, 604 and the main paths 612, 614 are orthogonal to one another on the x-y plane, and the tie paths 616, 618 are placed outside of the tie paths 606, 608 on the x-y plane.

The transmit coil section 6' has two parallel main paths 602' and 604' extending in the x-direction. The main paths 602' and 604' represent embodiments of the third and fourth electric paths of the present invention, respectively.

One end of the main path 602' is connected to the transmitter section 18 and the other end thereof is connected to one end of the main path 604' via a tie path 606'. The tie path 606' detours on the x-y plane on the side opposite to the side on which the main path 604' lies, and connects the other end of the main path 602' and the one end of the main path 604'. The other end of the main path 604' is connected to the other end of the tie path 610 via a tie path 608' which detours on the side opposite to the main path 602'.

The transmit coil section 6 also has two parallel main paths 612' and 614' extending in the y-direction. The main paths 612' and 614' represent embodiments of the eighth and ninth electric paths of the present invention, respectively.

One end of the main path 612' is connected to the transmitter section 18 and the other end thereof is connected to one end of the main path 614' via a tie path 616'. The tie path 616' detours on the x-y plane on the side opposite to the main path 614', and connects the other end of the main path 612' and the one end of the main path 614'. The tie path 616' is configured to pass inside of the tie paths 606' and 608'.

The other end of the main path 614' is connected to the other end of the tie path 610' via a tie path 618' which detours on the side opposite to the main path 612'. The tie path 618' is configured to pass inside of the tie paths 606' and 608'.

According to such electric path configuration, the main paths 602', 604' and the main paths 612', 614' are orthogonal to one another on the x-y plane, and the tie paths 616, 618' are placed inside of the tie paths 606', 608' on the x-y plane.

In such a transmit coil sections 6, 6', the main paths 602, 604, 602', 604' are connected in series by the tie paths 606, 608, 606', 608', 610 in a one-stroke continuous line. This forms a coil loop (indicated by solid line) in which the directions of the electric currents flowing through the main paths 602, 604 are the same and the directions of the electric currents flowing through the main paths 602', 604' are the same but opposite to those flowing through the main paths 602, 604.

The tie paths 606, 608, 606', 608', 610 together represent an embodiment of the fifth electric path of the present invention.

Similarly, the main paths 612, 614, 612', 614' are connected in series by the tie paths 616, 618, 616, 618', 610' in a one-stroke continuous line, thereby forming a coil loop (broken line) in which the directions of the electric currents flowing through the main paths 612, 614 are the same and the directions of the electric currents flowing through the main paths 612', 614' are the same but opposite to those flowing through the main paths 612, 614. The tie paths 616, 618, 616', 618', 610 together represent an embodiment of the tenth electric path of the present invention.

The coil loop indicated by solid line and that indicated by broken line have the respective main paths orthogonal to one another in the x-y plane, thereby constituting a so-called quadrature coil. Therefore, by supplying these two coil loops with respective RF electric currents having the same phase, an RF magnetic field having an increased strength can be obtained through vector composition of respective RF magnetic fields generated by these coil loops. Moreover, by supplying these two coil loops with respective RF electric currents having different phases by 90° from each other, an RF magnetic field rotating in a plane perpendicular to the z-direction can be obtained through vector composition of respective RF magnetic fields generated by these coil loops.

According to the quadrature coil, the tie paths 606, 608 and the tie paths 616', 618' which are the inside paths on the two x-y planes spaced apart in the z-direction, respectively, are configured to have the same length. Similarly, the tie paths 616, 618 and the tie paths 606', 608' which are the outside paths on the two x-y planes are configured to have the same length. Therefore, the two coil loops have the same total length. Thus, the respective load conditions on the two coil loops with respect to the transmitter section 18 is the same, enabling equalized RF driving.

Figure 3:
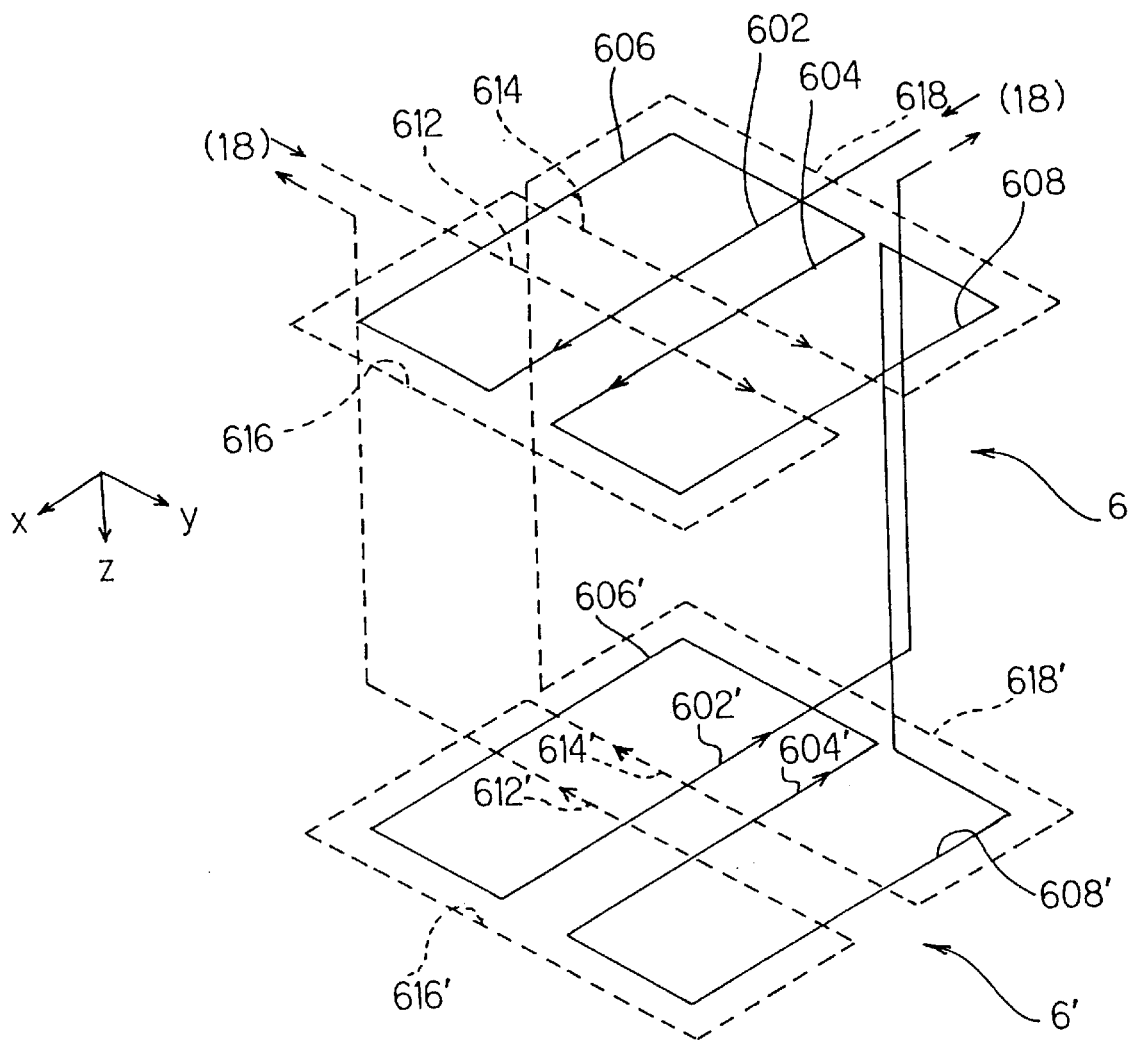
FIG. 3 is a schematic diagram illustrating the configuration of a transmit coil section in the apparatus in accordance with one embodiment of the present invention.

If inequality can be allowed to some extent, then, as exemplarily shown in FIG. 3, the tie paths 606, 608, 606', 608' of the coil loop indicated by solid line may be disposed inside of the tie paths 616, 618, 616', 618' of the coil loop indicated by broken line on both x-y planes, and vice versa.

Figure 4:
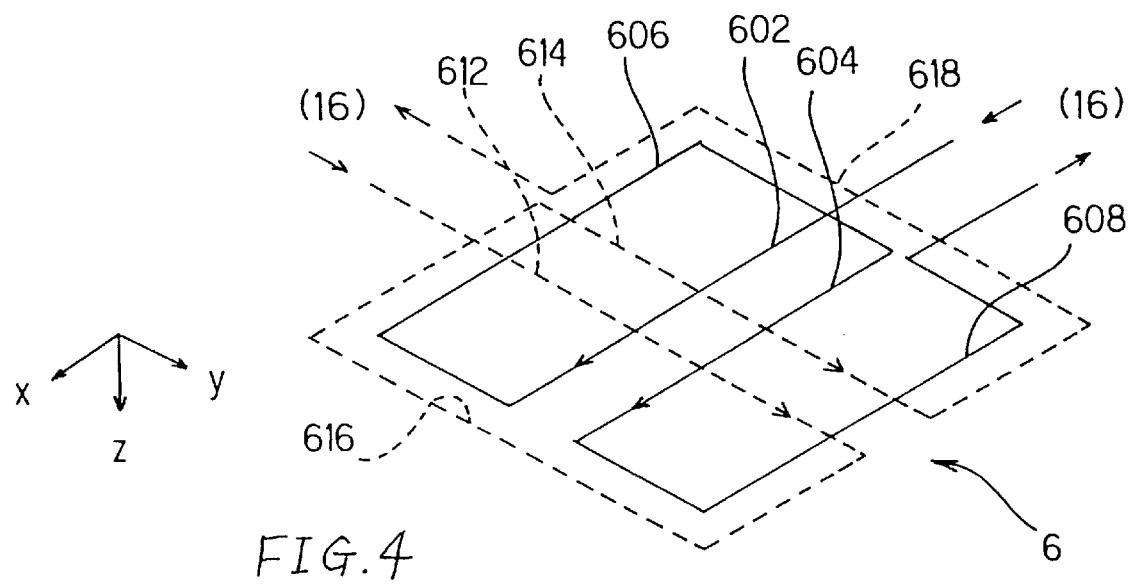
FIG. 4 is a schematic diagram illustrating the configuration of a transmit coil section in the apparatus in accordance with one embodiment of the present invention.

Moreover, the quadrature coil loop need not always be formed across two x-y planes, and it may be configured on only one x-y plane as exemplarily shown in FIG. 4.

As a conductive material to fabricate the coil loop having the pattern as described above on the x-y plane, a copper foil, for example, is employed. The copper foil is used to form the coil pattern comprising a flat electric path having a thickness of several ten micrometers and a width of several centimeters or ten or more centimeters, for example, on an insulating material such as a plastic substrate.

In this case, the two intersecting main paths are insulated by appropriate means. Moreover, the two tie paths, one of which is outside of or inside of the other on the x-y plane, are disposed spaced apart from each other at a distance equal to, for example, the width of the copper foil. Thus, the two coil loops do not overlap each other in the tie path portions which take a major part of the total length. Therefore, coupling between the two coil loops through drift capacity is significantly reduced, providing a quadrature coil having an excellent frequency property.

Figure 5:
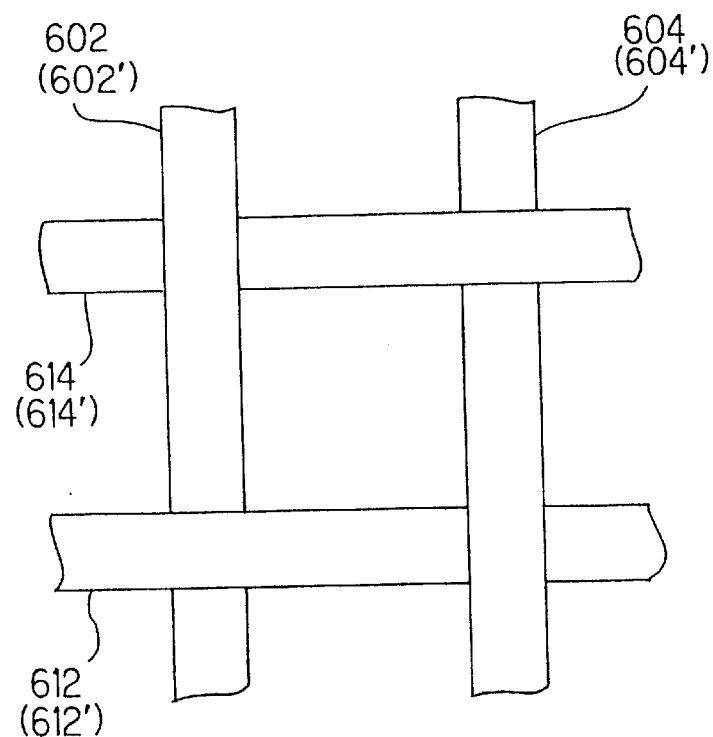
FIG. 5 is a schematic diagram illustrating the configuration of a part of the transmit coil section in the apparatus.

Additionally, it is preferred that the two main paths be crossed with their intersections interlaced with one another, as exemplarily shown in FIG. 5, in that the respective RF magnetic fields generated by the two coil loops are equalized.

Now the operation of the present apparatus will be described hereinafter. The apparatus is operated under the control of the control section 30. The following explanation refers to imaging by a spin-echo technique as a particular example of the magnetic resonance imaging. The spin-echo technique employs a pulse sequence as exemplarily shown in FIGS. 6(A)–6(F).

FIGS. 6(A)–6(F) are a schematic diagram of a pulse sequence for acquiring a magnetic resonance signal (spin-echo signal) for one view. Such pulse sequence is repeated, for example, 256 times to acquire the spin-echo signals for 256 views.

The execution of the pulse sequence and the acquisition of the spin-echo signal are controlled by the control section 30. However, the magnetic resonance imaging is not limited to being performed using the spin-echo technique but obviously other several techniques such as a gradient-echo technique may be employed.

As indicated by FIG. 6(F), the pulse sequence is divided into four periods (a)–(d) along the time axis. First, RF excitation is achieved by a 90° pulse P90 in the period (a) as shown in FIG. 6(A). The RF excitation is executed by the transmit coil sections 6, 6' driven by the transmitter section 18. Because the transmit coil sections 6, 6' are comprised of the quadrature RF coil configured as described above to have a good frequency property, the RF excitation can be done very efficiently.

Along with the RF excitation, the slice gradient magnetic field Gs is applied as shown in FIG. 6(B). The application of the slice gradient magnetic field Gs is performed by the gradient coil sections 4, 4 driven by the gradient driving section 16. The spins in a predefined slice within the subject 8 are thus excited (selective excitation).

Next, the phase-encoding gradient magnetic field Gp is applied in a period (b) as shown in FIG. 6(C). The application of the phase-encoding gradient magnetic field Gp is also performed by the gradient coil sections 4, 4' driven by the gradient driving section 16. The encoding of the spins is thus achieved.

Also in the phase-encoding period, rephasing of the spins is achieved by the slice gradient magnetic field Gs as shown in FIG. 6(B). In addition, the readout gradient magnetic field Gr is applied as shown in FIG. 6(D) to dephase the spins. The application of the readout gradient magnetic field Gr is also performed by the gradient coil sections 4, 4' driven by the gradient driving section 16.

Then, a 180° pulse P180 is applied in a period (c) as shown in FIG. 6(A), causing the spins to be inverted. The inversion of the spins is executed by the transmit coil sections 6, 6' RF-driven by the transmitter section 18. Because the transmit coil sections 6, 6' are comprised of the quadrature RF coil configured as described above to have a good frequency property, the inversion of the spins can also be done very efficiently.

Next, the readout gradient magnetic field Gr is applied in a period (d) as shown in FIG. 6(D). This generates a spin-echo signal MR from the subject 8 as shown in FIG. 6(B).

The spin-echo signal MR is received by the receive coil section 106. The receive coil section 106 receives the spin-echo signal of the L-spine. The received signal is input to the computer 24 via the receiver section 20 and the A-D converter section 22. The computer 24 stores the input signal of the receive coil section 106 into the memory as measurement data. Thus, spin-echo data for one view is collected from the receive coil section 106 into the memory.

The above operation is repeated, for example, 256 times in a predetermined cycle. The phase-encoding gradient magnetic field Gp is varied for each repetition, resulting in different phase encoding each time. This is indicated by a plurality of broken lines at the waveform of FIG. 6(C).

The computer 24 performs image reconstruction based on the spin-echo data for all views collected in the memory, and produces an image of the L-spine. The image thus produced is displayed on the display section 32 as a visible image.

Many widely different embodiments of the invention may be configured without departing from the spirit and the scope of the present invention. It should be understood that the present invention is not limited to the specific embodiments described in the specification, except as defined in the appended claims.

What is claimed is:

1. An RF coil comprising:
   when three mutually orthogonal directions are represented as an x-direction, a y-direction and a z-direction, a first electric path extending in the x-direction;
   a second electric path parallel to the first electric path in an x-y plane;
   a third electric path parallel to the first electric path in an x-z plane;
   a fourth electric path parallel to the third electric path in a plane parallel to the x-y plane, and parallel to the second electric path in a plane parallel to the x-z plane;
   a fifth electric path connecting the first–fourth electric paths in series so that the first and second electric paths carry respective electric currents in the same direction, and the third and fourth electric paths carry respective electric currents in the same direction opposite to the direction of the first and second electric paths;
   a sixth electric path extending in the y-direction in the x-y plane;
   a seventh electric path parallel to the sixth electric path in the x-y plane;
   an eighth electric path parallel to the sixth electric path in a y-z plane;
   a ninth electric path parallel to the eighth electric path in a plane parallel to the x-y plane, and parallel to the seventh electric path in a plane parallel to the y-z plane; and
   a tenth electric path connecting the sixth–ninth electric paths in series so that the sixth and seventh electric paths carry respective electric currents in the same direction, and the eighth and ninth electric paths carry respective electric currents in the same direction opposite to the direction of the sixth and seventh electric paths;
   wherein the fifth electric path and the tenth electric path do not overlap each other in the z-direction.

2. The RF coil of claim 1, wherein one of the fifth and tenth electric paths lies inside of the other one in the x-y plane, and the other one of the fifth and tenth electric paths lies inside of the one of the fifth and tenth electric paths in the plane parallel to the x-y plane.

3. An RF coil comprising:
   when three mutually orthogonal directions are represented as an x-direction, a y-direction and a z-direction, a first electric path extending in the x-direction;
   a second electric path parallel to the first electric path in an x-y plane; a fifth electric path connecting the first and second electric paths in series so that the first and second electric paths carry respective electric currents in the same direction;
   a sixth electric path extending in the y-direction in the x-y plane;
   a seventh electric path parallel to the sixth electric path in the x-y plane; and
   a tenth electric path connecting the sixth and seventh electric paths in series so that the sixth and seventh electric paths carry respective electric currents in the same direction;
   wherein the fifth electric path and the tenth electric path do not overlap each other in the z-direction.

4. A magnetic resonance imaging method comprising the steps of:
   when three mutually orthogonal directions in a space in which a subject is placed are represented as an x direction, a y-direction and a z-direction, generating a static magnetic field in the z-direction;
   generating gradient magnetic fields within the space; generating a high-frequency magnetic field within the space;
   measuring a magnetic resonance signal from the space; and
   producing an image based on the measured magnetic resonance signal;
   wherein the step of generating a high-frequency magnetic field is performed by employing an RF coil comprising:
   a first electric path extending in the x-direction;
   a second electric path parallel to the first electric path in an x-y plane;
   a third electric path parallel to the first electric path in an x-z plane;
   a fourth electric path parallel to the third electric path in a plane parallel to the x-y plane, and parallel to the second electric path in a plane parallel to the x-z plane;
   a first electric path connecting the first–fourth electric paths in series so that the first and second electric paths carry respective electric currents in the same direction, and the third and fourth electric paths carry respective electric currents in the same direction opposite to the direction of the first and second electric paths;
   a sixth electric path extending in the y-direction in the x-y plane;
   a seventh electric path parallel to the sixth electric path in the x-y plane;
   an eighth electric path parallel to the sixth electric path in a y-z plane;
   a ninth electric path parallel to the eighth electric path in a plane parallel to the x-y plane, and parallel to the seventh electric path in a plane parallel to the y-z plane; and
   a tenth electric path connecting the sixth–ninth electric paths in series so that the sixth and seventh electric paths carry respective electric currents in the same direction, and the eighth and ninth electric paths carry respective electric currents in the same direction opposite to the direction of the sixth and seventh electric paths;
   wherein the fifth electric path and the tenth electric path do not overlap each other in the z-direction.

5. A magnetic resonance imaging apparatus comprising:
   when three mutually orthogonal directions in a space in which a subject is placed are represented as an x-direction, a y-direction and a z-direction, static magnetic field generating means for generating a static magnetic field in the z-direction;

gradient magnetic field generating means for generating gradient magnetic fields within the space;

high-frequency magnetic field generating means for generating a high-frequency magnetic field within the space;

measuring means for measuring a magnetic resonance signal from the space; and image producing means for producing an image based on the magnetic resonance signal measured by the measuring means;

wherein the high-frequency magnetic field generating means comprises an RF coil comprising:

a first electric path extending in the x-direction;

a second electric path parallel to the first electric path in an x-y plane;

a third electric path parallel to the first electric path in an x-z plane;

a fourth electric path parallel to the third electric path in a plane parallel to the x-y plane, and parallel to the second electric path in a plane parallel to the x-z plane;

a fifth electric path connecting the first–fourth electric paths in series so that the first and second electric paths carry respective electric currents in the same direction, and the third and fourth electric paths carry respective electric currents in the same direction opposite to the direction of the first and second electric paths;

a sixth electric path extending in the y-direction in the x-y plane;

a seventh electric path parallel to the sixth electric path in the x-y plane;

an eighth electric path parallel to the sixth electric path in a y-z plane;

a ninth electric path parallel to the eighth electric path in a plane parallel to the x-y plane, and parallel to the seventh electric path in a plane parallel to the y-z plane; and a tenth electric path connecting the sixth–ninth electric paths in series so that the sixth and seventh electric paths carry respective electric currents in the same direction, and the eighth and ninth electric paths carry respective electric currents in the same direction opposite to the direction of the sixth and seventh electric paths;

wherein the fifth electric path and the tenth electric path do not overlap each other in the z-direction.

\* \* \* \* \*